United States Patent
Miyoshi

(10) Patent No.: US 7,147,805 B2
(45) Date of Patent: Dec. 12, 2006

(54) COMPOSITION FOR FORMING A TRANSPARENT CONDUCTING FILM, SOLUTION FOR FORMING A TRANSPARENT CONDUCTING FILM AND METHOD OF FORMING A TRANSPARENT CONDUCTING FILM

(75) Inventor: Takashi Miyoshi, Anan (JP)

(73) Assignee: Nichia Corporation, Anan (JP)

( * ) Notice: Subject to any disclaimer, the term of this patent is extended or adjusted under 35 U.S.C. 154(b) by 458 days.

(21) Appl. No.: 10/602,906

(22) Filed: Jun. 24, 2003

(65) Prior Publication Data

US 2004/0211941 A1 Oct. 28, 2004

(30) Foreign Application Priority Data

Jun. 28, 2002 (JP) ............................. 2002-190428
May 23, 2003 (JP) ............................. 2003-146147

(51) Int. Cl.
- *H01B 1/02* (2006.01)
- *B05D 5/12* (2006.01)
- *B05D 3/02* (2006.01)

(52) U.S. Cl. ............... 252/520.1; 427/58; 427/372.2; 427/377; 427/608

(58) Field of Classification Search ............... 252/500, 252/520.1, 506, 503
See application file for complete search history.

(56) References Cited

U.S. PATENT DOCUMENTS

| | | | | |
|---|---|---|---|---|
| 2,617,742 A | * | 11/1952 | Olson ........................... | 428/432 |
| 5,177,627 A | * | 1/1993 | Ishiwata et al. ............ | 349/162 |
| 6,777,477 B1 | * | 8/2004 | Niume et al. ............... | 524/430 |
| 2002/0074547 A1 | * | 6/2002 | Yudasaka et al. ............. | 257/57 |

FOREIGN PATENT DOCUMENTS

| | | | |
|---|---|---|---|
| JP | 60-243280 | | 12/1985 |
| JP | 1994-175144 A | | 6/1994 |
| JP | 1994175144 A | * | 6/1994 |
| JP | 2002-133956 | | 5/2002 |
| JP | 2002-175733 | | 6/2002 |
| JP | 2003045537 | * | 2/2003 |

OTHER PUBLICATIONS

Furusaki et al., "Preparation of ITO Thin Films by Sol-Gel Method," Journal of the Ceramic Society of Japan, 102(2), pp. 200-205, (1994).*

Chinese Office Action of Corresponding Chinese Application No. 03148967.2 dated Apr. 28, 2006.

Furusaki, et al., "Preparation of ITO Thin Films by Sol-Gel Method," Journal of the Ceramic Society of Japan 102[2] p. 200-205 (1994).

* cited by examiner

*Primary Examiner*—Mark Kopec
*Assistant Examiner*—Jaison Thomas
(74) *Attorney, Agent, or Firm*—Westerman, Hattori, Daniels & Adrian, LLP

(57) ABSTRACT

The composition of the present invention is one for forming a transparent conducting film, the composition comprising a water-soluble indium compound, a halogen-containing water-soluble organotin compound and a water-soluble organic high molecular compound. A method for forming a transparent conducting film according to the invention comprises the steps of i) applying to a substrate a solution for forming a transparent conducting film containing the composition in water or a solvent comprising water and an organic solvent, and ii) firing the coating film. This method may further include iii) the step of subjecting the film obtained in the firing step ii) to a reducing heat treatment.

16 Claims, No Drawings

COMPOSITION FOR FORMING A TRANSPARENT CONDUCTING FILM, SOLUTION FOR FORMING A TRANSPARENT CONDUCTING FILM AND METHOD OF FORMING A TRANSPARENT CONDUCTING FILM

BACKGROUND OF THE INVENTION

1. Field of the Invention

The present invention relates to a composition and a solution for forming a transparent conducting film and a method of forming a transparent conducting film using the solution, the transparent conducting film being useful as a transparent electrode in a display element of a liquid crystal display, plasma display, electroluminescence (EL), etc., a transparent electrode for a solar battery, a heating resistor for preventing fogging or frosting (freezing) in a window glass in front of a driver's seat of a vehicle or a pilot's seat of aircraft or in window panes of a building, or as an antistatic film, electromagnetic wave shielding film, infrared reflecting film, selectively light transmitting film and the like.

2. Description of Related Art

Use is made of materials which have a high transmittance for visible light and conductivity in forming transparent electrodes in display elements of liquid crystal, plasma, electroluminescence (EL) displays, etc., transparent electrodes for solar batteries, heating resistors for preventing fogging or frosting (freezing) in window glass of driver's seats of vehicles or pilot's seats of aircraft or in window panes of buildings, or in antistatic films, electromagnetic wave shielding films, infrared reflecting films, selectively light transmitting films and the like.

As such transparent conductive materials, tin oxide/antimony oxide(ATO) materials, indium oxide/tin oxide(ITO) materials and so on are known. The transparent conducting films made from these metal oxides are usually formed on glass or ceramic substrates. Among them, ITO (indium tin oxide) films find broadest application because of their high conductivity and transmittance.

Known methods of forming transparent conducting films include CVD methods (plasma CVD method and light CVD method), PVD methods (vacuum evaporation method, ion plating method and sputtering method) and coating method.

However, of the foregoing methods of forming transparent conducting films, CVD and PVD methods require large-scale equipment such as vacuum equipment. Furthermore, these methods require operation in a vacuum or inert atmosphere, and entail controlling the operational atmosphere. The CVD and PVD methods need to be improved in the low operational efficiency, high costs and unsuitability for mass production.

On the other hand, the coating method can easily form films in large quantities without the need for large-scale equipment, but involve defects depending on the film-forming materials as detailed below.

When using an organic acid indium having a high ionic bonding character such as indium octylate, the organic acid indium is likely to hydrolyze and relatively easily undergoes chemical change so that gelation occurs during preparation of the coating solution or during coating deposition. When the coating solution gels, the uniformity of obtained films is lowered and the conductivity and transmittance thereof are reduced.

In the method by which a coating solution containing a metal alkoxide as its main component is applied and an ITO film is formed by a sol-gel process, the metal alkoxide solution to be used as a coating solution usually contains a metal alkoxide such as methoxide, ethoxide or isopropoxide of indium or tin, and optionally additives for stabilization. Since metal alkoxides easily hydrolyze, the synthesis and subsequent handling of the metal alkoxide must be done in an inert atmosphere, resulting in a poor operational efficiency. When a metal alkoxide solution is applied to the substrate and is left to stand thereon for a long time, or the humidity of the operational atmosphere is high, the uniformity of the film is impaired because the metal alkoxide easily hydrolyzes, consequently resulting in difficulty in forming a conducting film of low resistance.

Journal of the Ceramic Society of Japan 102 [2]200–205 (1994) discloses an example of formation of an ITO film from indium nitrate trihydrate, anhydrous tin(IV) chloride, polyvinyl alcohol and water by a sol-gel process. According to the disclosed method, colloidal particles containing indium and tin are precipitated and separated by centrifugation. The particles are then ultrasonically dispersed in an aqueous solution of indium chloride or hydrochloric acid to form a sol. Thereafter polyvinyl alcohol is added to the sol as a film-forming aid, and the mixture is deposited on the substrate. Subsequently the coating film is dried to form a gel film. The gel film is fired at 550° C. to give an ITO film.

However, this method requires such complicated steps as precipitation of colloidal particles, centrifugation, ultrasonic dispersion, drying and firing.

Japanese Unexamined Patent Publication No. 2002-175733 describes a coating solution for forming an ITO transparent conducting film, the coating solution being prepared by adding a surfactant to a solution to improve the compatibility of the solution with the substrate, the solution comprising indium chloride and tin(II) chloride or tin(IV) chloride dissolved in water, alcohol or a mixture of water and alcohol. The publication further discloses a method wherein a thin film having a thickness of 15 nm or less is formed by application of the solution in one step by a dip coating method, whereby the unreacted residue in the film is decreased resulting in enhanced film quality.

However, a coating solution containing water has a markedly high surface tension, so that an improvement in wettability between the coating solution and the substrate by addition of the surfactant can not be expected. In particular it is presumed that numerous broken parts such as partially formed pinholes would tend to occur in the thin film formed by application of the solution in one step as described above. A multilayer film may be produced by laminating layers to repair the broken parts in the film, resulting in increased conductivity, but with lower operational efficiency and reduced mass-productivity. Furthermore, thin films formed by application of the solution in one step have significantly lower transmittance despite their thinness. A multilayer film produced by laminating such thin films is likely to have further lowered transmittance because light is entrapped between the layer interfaces. Therefore, it is difficult to obtain an ITO film having both good conductivity and a high transmittance using the coating solution and the method stated in Japanese Unexamined Patent Publication No. 2002-175733.

Japanese Unexamined Patent Publication No. 1994-175144 discloses a method using alkyl indium and alkyl tin. Generally alkyl metal compounds are significantly unstable and include, for example compounds which spontaneously ignite in air at room temperature such as triethyl indium.

A method using an organic complex of indium or tin was also proposed. However, the method necessitates use of an organic solvent at a high ratio to prepare a coating solution from an organic complex. Therefore, the solution is not preferrable from the viewpoint of labor hygiene, fire prevention and the global environment.

Further, when a transparent conducting film is used as the transparent electrode of a display device, patterning of the transparent electrode is reqired. Patterning is generally carried out by a method comprising complicated photolithographic (circuit patterning) step using photosensitive resist, etching, resist separation and the like. The ink jet printing method which forms a circuit pattern directly on the substrate is available as a simpler method. However this method is unable to use commercially available ink jet printing devices equipped with ink cartridges and other parts which are corroded by contact with organic solvents.

BRIEF SUMMARY OF THE INVENTION

The first object for the present invention is to provide a method of forming a transparent conducting film having a high transmittance by a simple coating method, a composition for forming a transparent conducting film and a solution for forming a transparent conducting film which are used in the method, the composition and the solution being capable of forming a transparent conducting film having a high transmittance.

The second object for the present invention is to provide a method of forming a transparent conducting film having a low resistance and a high transmittance by a simple coating method, as well as a composition for forming a transparent conducting film and a solution for forming a transparent conducting film to be used in the method, the composition and the solution being capable of forming a transparent conducting film having a low resistance and a high transmittance.

To achieve these objects of the invention, the present inventor conducted extensive research and found the following:

i) By applying a coating solution comprising a water-soluble indium compound, a water-soluble organotin compound and water-soluble organic high molecular compound as uniformly dissolved in a solvent comprising water or in a solvent comprising water and an organic solvent onto the substrate and firing the applied solution, a uniform ITO film can be easily formed. This ITO film is uniform and therefore has a high transmittance. The uniform film termed herein means a state in which the thickness of the entire film and the distribution of elements throughout the entire film are uniform.

ii) Generally, when using a coating solution containing film-constituting substances in a water-including solvent, it is difficult to uniformly apply the coating solution onto the substrate because of the high surface tension of the coating solution. However, since the composition for forming a transparent conducting film contains a water-soluble organic high molecular compound, the capability in forming a film on the substrate is improved such that a uniform coating film can be formed on the substrate.

iii) By adjusting the contents of halogen and carbon in the composition, the conductivity of the ITO film can be adjusted to a desired value corresponding to the purpose of use without impairing the uniformity of the film.

iv) When the difference, as determined by a differential thermal analysis, in the first endothermic peak temperature between the water-soluble indium compound and the halogen-containing water-soluble organotin compound used as raw materials in the composition of the invention is 100° C. or less, the temperature at which the indium compound initiates decomposition and the temperature at which the tin compound starts to decompose approximate to each other, so that the temperature at which the indium ions initiate oxidation reaction, the temperature at which the tin ions initiate oxidation reaction and the temperature at which incorporation of the carbon and/or halogen into the film begins are all close to each other, which presumably results in the virtually uniform distribution of these elements in the obtained film. Consequently, a more uniform ITO film having a high transmittance is obtained.

v) By carrying out the foregoing firing of the coating film in an atmosphere which has a higher partial oxygen pressure than air, the conductivity of the obtained film is increased and an ITO film having a low resistance and a high transmittance is obtained.

vi) By carrying out a reducing heat treatment after firing the coating film, the conductivity of the obtained film is further increased and an ITO film having a lower resistance and a higher transmittance is obtained.

The invention was completed based on the foregoing novel findings and provides the following compositions and solutions for forming a transparent conducting film, methods for forming a transparent conducting film, and transparent conducting films.

Item 1. A composition for forming a transparent conducting film, the composition comprising a water-soluble indium compound, a halogen-containing water-soluble organotin compound and a water-soluble organic high molecular compound.

Using a solution prepared by dissolving the composition of Item 1 in water or in a solvent comprising water and an organic solvent, and by carrying out a coating method comprising the simple steps of applying the solution onto the substrate and firing the coating film, an ITO film of high transmittance is formed.

The composition can be uniformly dissolved in water or a solvent comprising water and an organic solvent since the substances constituting the composition are all soluble in water. The use of obtained uniform solution as coating liquid is one of reasons for the formation of an ITO film of high transmittance.

Even when the coating solution is prepared using a solvent including water, a coating film can be uniformly formed or a substrate because the composition contains a water-soluble organic high molecular compound. This is another reason for the formation of an ITO film of high transmittance.

The ITO film formed from the composition of the invention tends to have halogen and carbon uniformly distributed therein. Generally ITO films wherein halogen and carbon remain have been considered merely defective. However, by use of the composition of the invention, these elements can be uniformly distributed throughout the obtained ITO film. By adjusting the contents of these elements in the composition, the conductivity of the ITO film can be adjusted to a desired value without impairing the uniformity of the film.

Moreover, the composition comprises water-soluble substances and therefore allows the use of water as a solvent for preparing the coating liquid, and accordingly it is preferrable from the viewpoint of labor hygiene, fire safety and environmental preservation. Additionally, the film can be formed using devices having parts which are corroded or otherwise changed in properties in the presence of an organic solvent.

Item 2. The composition for forming a transparent conducting film according to Item 1, wherein the halogen-containing water-soluble organotin compound shows a first endothermic peak temperature of 75° C. or higher in the differential thermal analysis curve.

In the composition of Item 2, the halogen-containing water-soluble organotin compound of Item 2 preferably has a first endothermic peak temperature of 75 to 600° C. in the differential thermal analysis curve in view of the uniformity of the film formed from the composition. When the first endothermic peak temperature is higher than 600° C., it is difficult to adjust incorporation of carbon and/or halogen into the film, whereas a first endothermic peak temperature of less than 75° C. impairs the uniformity of In, O and Sn within the film.

Item 3. The composition for forming a transparent conducting film according to Item 1 or 2, wherein the difference between the first endothermic peak temperature of the water-soluble indium compound and the first endothermic peak temperature of the halogen-containing water-soluble organotin compound in the differential thermal analysis curve is 100° C. or less.

In the compositions as defined in Items 2 and 3, the temperature at which the indium compound starts to decompose approximate to the temperature at which the tin compound starts to decompose, and the temperature at which the indium ions initiate oxidation, the temperature at which the tin ions initiate oxidation and the temperature at which carbon and/or halogen begin to be incorporated into a film are all close to each another. Oxidation reactions and incorporation of carbon and/or halogen into the film thereby uniformly take place at the time of firing, whereby a more uniform ITO film with no or few conductivity irregularities is formed.

Item 4. A solution for forming a transparent conducting film, the solution having the composition according to Item 1, 2 or 3 dissolved in a solvent comprising water or in a solvent comprising water and an organic solvent.

The solution of Item 4 can achieve the same effects as the composition of Item 1, 2 or 3.

Item 5. The solution for forming a transparent conducting film according to Item 4, wherein water is present in a ratio of 10 to 100 wt. % based on the total amount of solvent, and the water-soluble organic high molecular compound is present in a ratio of 0.03 to 10 wt. % based on the total amount of solution.

In the solution of Item 5, an organic solvent is not necessarily used as a solvent. The coating solution can be prepared by dissolving the film-constituting elements in water or a solvent mainly containing water. Such solutions are preferred from the viewpoint of labor hygiene, fire protection and the global atmosphere. Since the solution contains a water-soluble organic high molecular compound, a coating film can be uniformly formed on a substrate even with use of a solution prepared using a solvent containing water. This is one of reasons in formation of an ITO film of high transmittance. The surface tension of the coating solution can be reduced by addition of an organic solvent to more easily form the coating film. Consequently the amount of the water-soluble organic high molecular compound used can be decreased. By this synergistic effect, the film formed after firing is denser and a more uniform ITO film can be obtained.

Item 6. The solution for forming a transparent conducting film according to Item 4 or 5, which has a surface tension of 20 to 70 mN/m and a viscosity of 20 mPa·s or less.

The solution of Item 6 can be easily applied by an ink jet method and allows formation of an ITO film in a complicated pattern with high mass-productivity. Since the content of organic solvent components is controlled, the solution can be used in an ink jet device which may be corroded by organic solvent components.

Item 7. A method for forming a transparent conducting film, which comprises the steps of (1) applying the solution of Item 4, 5 or 6 to the substrate, and (2) firing the coating film.

An ITO film with a high transmittance can be formed by the simple steps of application and firing according to the method of Item 7.

Item 8. The method for forming a transparent conducting film according to Item 7, wherein the firing of step (2) is carried out in an atmosphere which has higher partial oxygen pressure than air.

An ITO film of low resistance and high transmittance can be obtained according to the method of Item 8.

Item 9. The method of forming a transparent conducting film according to Item 7 or 8, which further comprises a step of subjecting the film obtained in step (2) to a reducing heat treatment.

According to the method of Item 9, free electrons are generated in the film by the reducing heat treatment, thereby increasing the conductivity of the film so that the film is imparted with higher conductivity, i.e., lower resistance.

Item 10. A transparent conducting film containing elements of indium, tin, oxygen, carbon and halogen which are uniformly distributed therein.

Item 11. The transparent conducting film according to Item 10, wherein the density distribution of the elements is uniform when the surface and cross section of the film are observed with an electron probe microanalyser.

The transparent conducting films of Items 10 and 11 have a high transmittance because the constituent elements are uniformly present.

Item 12. The transparent conducting film according to Item 10 or 11, which has an irregularity of film thickness of 0.2% or less based on the measured thickness, a measured thickness of 0.01 to 0.4 μm, and a transmittance of 90 to 98% averaged over the wavelength range of 420 to 820 nm.

Item 13. The transparent conducting film according to Item 10 or 11, which has a transmittance of 92 to 98% averaged over the wavelength range of 420 to 820 nm when the film has a measured thickness of 0.01 to 0.15 μm, has a transmittance of 90 to 97% averaged over the above wavelength range when the film has a measured thickness of 0.15 to 0.25 μm, and has a transmittance of 90 to 96% averaged over the above wavelength range when the film has a measured thickness of 0.25 to 0.4 μm.

Item 14. The transparent conducting film according to any of Items 10 to 13, which has a surface resistivity of $10^2$ to $10^8$ Ω/□.

Item 15. A transparent conducting film which contains indium, tin, oxygen, carbon and halogens, and has a transmittance of 90 to 98% averaged over the wavelength range of 420 to 820 nm when the film has a measured thickness of 0.01 to 0.4 μm.

Item 16. The transparent conducting film according to Item 15, wherein the surface resistivity is $10^2$ to $10^8$ Ω/□.

Item 17. A transparent conducting film which contains indium, tin, oxygen, carbon and halogens, and has a transmittance of 92 to 98% averaged over the wavelength range of 420 to 820 nm when the film has a measured thickness of 0.01 to 0.15 μm, has a transmittance of 90 to 97% averaged over the above wavelength range when the film has a measured thickness of 0.15 to 0.25 μm, and has a transmittance of 90 to 96% averaged over the above wavelength range when the film has a measured thickness of 0.25 to 0.4 μm.

Item 18. The transparent conducting film according to Item 17, wherein the surface resistivity is $10^2$ to $10^8$ Ω/□.

In short, the present invention provides a method of forming a transparent conducting film having a high transmittance by a simple coating procedure, a composition for forming a transparent conducting film and a solution for forming a transparent conducting film which are used in the foregoing method, the composition and the solution being capable of forming a transparent conducting film having a high transmittance.

More specifically, since the composition of the invention comprises water-soluble substances, a coating solution can be prepared by use of water, so that such solutions are preferable from the viewpoint of labor hygiene, fire protection and the global environment. Since the coating solution can be prepared from the composition of the invention by use of water, it is possible that when a commercially available ink jet printing device is used, corrosion or deterioration of an ink cartridge of the device by organic solvents can be avoided. In forming a circuit pattern from a transparent conducting film, the circuit pattern can be directly formed by an ink jet method that is simple compared with methods of forming circuit patterns by photolithography or the like subsequent to forming the transparent conducting film. When the composition of the invention is used, a circuit pattern can be conveniently formed using a commercially available ink jet printing device.

When preparing a coating solution using water or a solvent mainly comprising water, the coating film may not be uniformly formed on the substrate because of the high surface tension of the coating solution. However, since the composition of the invention contains a water-soluble organic high molecular compound, a uniform coating film can be formed on a substrate even when using a coating solution containing water or a solvent mainly comprising water, so that the uniformity of the film is thereby enhanced, and an ITO film having a high transmittance for visible light can be obtained.

The composition of the invention comprises water-soluble compounds, and a coating solution is prepared by uniformly dissolving the water-soluble compounds in a solvent including water with the result that an ITO film of high transmittance can be obtained.

The conductivity of the obtained film can be adjusted to a desired value without impairing the uniformity of the film by adjusting the ratio of halogen and carbon elements in the composition of the invention.

When the difference in the first endothermic peak temperature between the water-soluble indium compound and the halogen-containing water-soluble organotin compound, as determined by differential thermal analysis, is 100° C. or less the thermal decomposition-onset temperatures of both compounds are close to each other, so that the indium ions and the tin ions are uniformly oxidized. Consequently In—O—Sn linkages are uniformly formed throughout the film, giving a transparent conducting film which has a low degree of conductivity irregularity, low resistance and high transmittance.

When the solution of the invention has a surface tension of about 20 to about 70 mN/m and a viscosity of 20 mPa·s or less, the solution is used as a solution for forming a transparent conducting film particularly suitable for forming an ITO film by an ink jet method. A light-emitting device made of an ITO film pattern formed by an ink jet method gives off a uniform light, and external light such as sunlight would be unlikely to fall, consequently suppressing the possibility of mistaking an off-state for an on-state due to external light.

The method of the invention does not require such a large-scale apparatus as used in CVD methods, PVD methods and the like, and can form a transparent conducting film on a substrate in air by a simple procedure at low cost. Since the method of the present invention employs a coating process, the method is not limited by the size of a chamber for forming films. Consequently a transparent conducting film can be easily formed on a substrate of large area, and can be uniformly formed on a curved surface of the substrate.

Unlike a hitherto known sol-gel process among coating methods, the method of the invention can employ a coating solution prepared merely by dissolving the water-soluble indium compound, halogen-containing water-soluble organotin compound and water-soluble organic high molecular compound in a solvent.

In the method of the invention, when the firing step is carried out in an atmosphere which is higher in partial oxygen pressure than air, the conductivity of the conducting film is increased and an ITO film having lower resistance and higher transmittance can be obtained.

In the method of the invention, oxygen deficiency is caused and free electrons are generated in the film when the film is subjected to a reducing heat treatment after firing. The conductivity of the obtained film is thereby increased.

In view of the recent trend in producing large-size and high-precision liquid crystal displays and large-area solar batteries, there is a demand for reduction of the resistance of transparent conducting films and a simplified method of forming such films of large area. Consequently, the significance of the invention is very important because a transparent conducting film of low resistance and high transmittance can be easily formed by the invention.

DETAILED DESCRIPTION OF THE INVENTION

The present invention will be described in detail below.

(I) Composition for Forming a Transparent Conducting Film

The composition of the invention for forming a transparent conducting film comprises a water-soluble indium compound, a halogen-containing water-soluble organotin compound and a water-soluble organic high molecular compound.

Water-Soluble Indium Compound

The water-soluble indium compound is any which is soluble in water and include known water-soluble indium compounds without limitation. Examples of water-soluble indium compounds are indium chloride, indium bromide, indium iodide, indium nitrate, indium perchlorate and indium sulfate. The water-soluble indium compound to be used may have water of crystalyzation. The water-soluble indium compounds can be used alone or at least two of them may be used in combination.

Among these, indium chloride, indium nitrate, indium perchlorate and indium sulfate are preferable. Indium chloride and indium nitrate are more preferable.

Halogen-Containing Water-Soluble Organotin Compound

The halogen-containing water-soluble organotin compound, for example, include, but not limited to, a compound represented by the formula (1)

$$R_nSnX_{4-n} \tag{1}$$

wherein R is an alkyl group having 1 to 3 carbon atoms, X is a halogen atom and n is an integer from 1 to 3.

In the compound represented by the formula (1), examples of the alkyl group having 1 to 3 carbon atoms are methyl, ethyl, n-propyl and iso-propyl. In particular R is preferably methyl or ethyl. Halogen atoms include fluorine, chlorine, bromine and iodine. Among them, chlorine is preferred. Preferably n is 2.

Such halogen-containing water-soluble organotin compounds can be used alone or at least two of them may be used in combination.

Preferred Combinations of Water-Soluble Indium Compound and Halogen-Containing Water-Soluble Organotin Compound It is preferable to use the water-soluble indium compound and the halogen-containing water-soluble organotin compound in such a combination that the difference between the first endothermic peak temperature of the water-soluble indium compound and the first endothermic peak temperature of the halogen-containing water-soluble organotin compound in the differential thermal analysis curve is 100° C. or less, especially 80° C. or less or further especially 60° C. or less. The smaller the difference in the endothermic peak temperature between them is, the better.

When a plurality of water-soluble indium compounds and/or a plurality of halogen-containing water-soluble organotin compounds are used, the peak temperature at which the largest heat absorption is observed for each raw material is referred to as a first endothermic peak temperature. When a plurality of endothermic peaks of the same amount of heat absorption exist, the lowest endothermic peak temperature is taken as a first endothermic peak temperature. The difference in the thus defined first endothermic peak temperature between water-soluble indium compounds and halogen-containing water-soluble organotin compounds is preferably in the above-defined range.

The term "differential thermal analysis curve" used herein refers to a curve which plots differential thermal analysis values obtained when a substance to be tested is heated in air at a constant temperature-elevating rate. The first endothermic peak temperature in the differential thermal analysis curve refers to a temperature at which a peak with the largest heat absorption is observed, in the curve, among the endothermic peaks detected during endothermic decomposition of the substance to be tested, and is the value determined by the differential thermal analysis method (JIS K0129-94) described in EXAMPLE.

When the difference in the first endothermic peak temperature is too large, there exists a great difference in oxidation reaction efficiency between the indium ions and tin ions so that the reaction for forming In—O—Sn is unlikely to proceed uniformly, occationally resulting in formation of uneven ITO film with high resistivity regions being formed in the film. The reason therefor is as follows: excessively large difference in thermal decomposition temperature between the indium compound and the tin compound tends to include the formation of an ITO layer around tin oxide in the firing step, because indium ions are supplied after tin oxide is formed to some extent in the film, and the thus obtained film tends to become irregular in resistivity and transmittance throughout the film.

For example, a film is likely to become irregular in resistivity when using indium chloride trihydrate(first endothermic peak temperature: about 185° C.) as the indium compound, and tin(II) chloride dihydrate(first endothermic peak temperature: about 48° C.) or tin(IV) chloride pentahydrate (first endothermic peak temperature: about 60° C.) as the tin compound.

In contrast, a halogen-containing water-soluble organotin compound is used as the water-soluble tin compound in the invention, and a halogen-containing water-soluble organotin compound that is relatively high in the first endothermic peak temperature is selected as the water-soluble tin compound, and thereby its thermal decomposition temperature and thermal decomposition efficiency is close to those of the water-soluble indium compounds which begins thermal decomposition at high temperature. Thus, the initiation temperatures and the efficiencies of the indium ion oxidation reaction, the tin ion oxidation reaction and the incorporation of carbon and/or halogen atoms are all close to each other. As a result, when the composition is applied to the substrate and fired, an In—O—Sn linkages are formed uniformly throughout the film and carbon and/or halogen are uniformly distributed therethrough, whereby an ITO film is obtained that exhibits no or little irregularity in resistance and shows a lower resistance and a higher transmittance throughout the entire film. For example, a conducting film for use as a pen input touch panel is required to have high positional precision, i.e. high uniformity in resistance between positions. The conducting film formed from the composition having said difference in endothermic peak temperature can be suitably used, for example, as the conducting film of the pen input touch panel.

To afford such difference in first endothermic peak temperature, it is preferred to use a halogen-containing water-soluble organotin compound that has a first endothermic peak temperature of about 75 to about 600° C., especially about 90 to about 550° C., further especially about 100 to about 500° C. Dimethyltin dichloride($(CH_3)_2SnCl_2$) and the like are exemplified as halogen-containing water-soluble organotin compounds that have a first endothermic peak temperature of about 100 to about 500° C.

In particular, a combination of dimethyltin dichloride (first endothermic peak temperature:about 108° C.) and indium chloride trihydrate (first endothermic peak temperature:about 185° C.), that shows a difference in first endothermic peak temperature of 80° C. or less is preferable and further a combination of dimethyltin dichloride (first endothermic peak temperature about 108° C.) and indium nitrate trihydrate (first endothermic peak temperature: about 162° C.), that shows a difference in first endothermic peak temperature of 60° C. or less, is preferable.

Examples of combinations in which a difference in first endothermic peak temperature exceeds 100° C. are a combination of tin(II) chloride dehydrate (first endothermic peak temperature: about 48° C.) and indium chloride trihydrate (first endothermic peak temperature: about 185° C.) (temperature difference: about 137° C.); a combination of tin(II) chloride dihydrate (first endothermic peak temperature: about 48° C.) and indium nitrate trihydrate(first endothermic peak temperature: about 162° C.)(temperature difference: about 114° C.); a combination of tin(IV) chloride pentahydrate (first endothermic peak temperature: about 60° C.) and indium chloride trihydrate (first endothermic peak temperature: about 185° C.) (temperature difference: about 125° C.); a combination of tin(IV) chloride pentahydrate (first endothermic peak temperature: about 60° C.) and indium nitrate trihydrate (first endothermic peak temperature: about 162° C.) (temperature difference: about 102° C.); etc. Unlike the halogen-containing water-soluble organotin compounds, the tin compounds in these combinations decompose with high efficiency at a significantly lower temperature than the indium compounds so that the distribution of elements in the film becomes irregular and the film, even when thin, is cosidered to show a low transmittance.

Water-Soluble Organic High Molecular Compound

The composition of the invention contains an organic high molecular compound so that even when the coating solution is prepared using water, the coating film can be uniformly formed on the substrate, and thus an ITO film of high transmittance can be obtained.

Useful water-soluble organic high molecular compounds include those known hitherto, without limitation, and can be any compounds which are liquid or solid at room temperature and soluble in water at room temperature and soluble in water by heating.

In particular, preferred are water-soluble organic high molecular compounds which do not cause precipitaion of insolubles by contact with the water-soluble indium compound and the halogen-containing water-soluble organotin compound. Examples of such water-soluble organic high molecular compounds are polyacrylic acids such as polyacrylamide; polymethacrylic acids such as polymethacrylamide; polyvinyl ethers such as polymethoxyethylene, polyethoxyethylene, polypropoxyethylene and poly-2-methoxyethoxyethylene; polyvinyl alcohols such as polyvinyl alcohol; polyoxides such as polyethylene glycol, polypropylene glycol, polyethylene glycol methyl ether and polyethylene glycol ethyl ether; celluloses such as methyl cellulose; polyvinyl pyrrolidone; polyvinyl acetamide; etc. Such water-soluble organic high molecular compounds can be used alone or in combination.

Among them, polyvinyl alcohols, polyoxides and polyvinyl pyrrolidone are preferable, and polyvinyl alcohol, polyethylene glycol and polyvinyl pyrrolidone are especially preferable.

The preferred value of the weight average molecular weight of the water-soluble organic high molecular compound is, although not limited to, usually about 1,000 to about 5,000,000, especially about 10,000 to about 4,000,000, further especially about 20,000 to about 1,000,000. If the molecular weight is too low, the film-forming properties on the substrate are significantly lowered, making it difficult to form a uniform film. If the molecular weight is too high, solubility of the water-soluble organic high molecular compound lowers, making it difficult to obtain a uniform solution. Insofar as the above-described range is employed, such problems are not encountered. Even when a solution is prepared using a solvent containing water, the film-forming properties between the solution and the substrate on which it is applied can be sufficiently increased. Thus a notably uniform coating film can be formed on the substrate.

Additives

The composition of the invention may contain additives usually incorporated into compositions for forming transparent conducting films. Useful additives may be either those soluble in water or those having a relatively low solubility in water. When an additive sparingly soluble in water is used, the additive may be dissolved in a solvent including a suitable organic solvent.

For example, the composition may contain a thermal decomposition catalyst for promoting the thermal decomposition of the composition to thereby impart a high transmittance to the transparent conducting film formed by the method of the invention as described later.

Useful thermal decompostion catalysts include compounds known per se, such catalysts include peroxides or nitro substances. A catalyst having a relatively small number of carbon atoms is preferably used in order to prevent carbon derived from the catalyst from remaining in the film after thermal decomposition. Such thermal decomposition catalysts include, for example, hydrogen peroxide, trinitrotoluene, or picric acid.

The composition of the invention may further contain other additives such as surfactants (e.g. sodium alkyl ether sulfate) to be usually added to compositions for forming transparent conducting films. The incorporation of a surfactant in the composition of the invention improves the wettability with respect to the substrate, thereby allowing more uniform formation of coating film and enhancing the conductivity of the obtained ITO film and transmittance thereof.

Ratio of Components

Preferred content of metal compounds, i.e., the water-soluble indium compound and halogen-containing water-soluble organotin compound in the composition of the invention is about 20 to about 99 wt. % based on the total amount of the composition, especially about 50 to about 98 wt. %, further especially about 70 to about 97 wt. %. If the content of these metal compounds is too low, only a very thin ITO film having defects such as pinholes can be obtained and the uniformity of the film is poor. In contrast, if the metal compounds content is too high, it is difficult to form a uniform film, and cracks would be likely to occur after firing the coating film. The above-defined range of contents of these components would avert the foregoing problems.

It is preferable that the molar ratio of the water-soluble indium compound to halogen-containing water-soluble organotin compound (water-soluble indium compound:halogen-containing water-soluble organotin compound) is approximately 198:1 to 2:49, especially approximately 98:1 to 8:1. When the ratio of the water-soluble indium compound and halogen-containing water-soluble organotin compound is adjusted to this range, and the molar ratio of indium oxide ($In_2O_3$): tin oxide ($SnO_2$) in the finally obtained ITO film is approximately 99:1 to 2:98, preferably approximately 98:2 to 8:2, and more preferably approximately 9:1, a transparent conducting film which is excellent in transmittance and conductivity can be obtained. When the content of indium relative to tin is too high or too low, the resistance of the ITO film is increased. In the above-mentioned content range, an ITO film of sufficiently low resistance can be obtained The preferred content of the water-soluble organic high molecular compound is about 1 to about 80 wt. % based on the total amount of the composition, especially about 1 to about 65 wt. %, further especially about 1 to about 30 wt. %. If the content of the water-soluble organic high molecular compound is too high, cracks would be likely to be generated in firing the coating film, failing to give a uniform film, and the carbon derived from the high molecular compound would tend to partially remain in the film after firing, resulting in reduction in conductivity of the obtained ITO film. If the content of water-soluble organic high molecular compound is too low, a coating film can not be uniformly formed on the substrate. If the content of the compound is in the above-described range, a uniform and highly conducting film is obtainable without such problems being raised.

Additives such as thermal decomposition catalyst can be added in an amount which would not lower the transmittance of the obtained film nor impair conductivity.

The conductivity of the obtained transparent conducting film can be easily adjusted without deteriorating the uniformity of the film by adjusting the ratio of the total content of carbon and halogen contained in the composition of the invention. In the prior art, the conductivity of the film has been finely adjusted by adjusting the film-forming temperature and the ratio of indium and tin raw materials. By use of the composition of the invention, the conductivity of the transparent conducting film can be adjusted over a wide range (such as a range of $10^2$ to $10^8$ $\Omega/\square$). Thereby a transparent conducting film can be obtained that finds broad range of applications: as a transparent electrode, electromagnetic wave shielding film, electrostatic interference-inhibitive film, antistatic film and so on.

(II) Solution for Forming a Transparent Conducting Film

The solution of the invention for forming a transparent conducting film comprises a water-soluble indium compound, a halogen-containing water-soluble organotin compound and a water-soluble organic high molecular compound dissolved in water or in a solvent comprising water and an organic solvent. That is, the solution of the invention for forming a transparent conducting film is one comprising the composition of the invention dissolved in water or in a solvent comprising water and an organic solvent.

In the solution of the invention, all of the water-soluble indium compounds, halogen-containing water-soluble organotin compounds, water-soluble organic high molecular compounds and other additives are dissolved in a solvent to give the uniform solution.

The solution of the invention contains the substances uniformly dissolved in a solvent and therefore can form a uniform coating film when used in the method of the invention (comprising a coating step and a firing step) as described later with the result that an ITO film having a high transmittance is formed. That is, the solution of the invention can be suitably used as a coating solution employable in the method of the invention for forming a transparent conducting film as described later.

Solvent

The solvent to be used is water or a solvent mixture comprising water and an organic solvent. Since the film-constituting substances and additives are soluble in water in the invention, an organic solvent is not necessarily used as a co-solvent. Thus the coating solution can be prepared by dissolving the film-constituting substances in water or in a solvent comprising mainly water. This is preferable from the viewpoint of labor hygiene, fire protection and the global environment. A circuit pattern composed of an ITO film can be more conveniently directly formed by an ink jet method compared with a method of forming a circuit pattern by photolithography or the like after forming the ITO film. A commercially available ink jet device is constructed utilizing parts made of materials which are corroded or otherwise deteriorated by organic solvents. The method of the invention can suppress the use of organic solvents so that a circuit pattern can be conveniently produced using a commercially available ink jet device.

Depending on the combination of the type of substances contained in the composition of the invention, materials of the substrate, methods for coating and so on; when a coating solution is prepared using only water as a solvent, the coating film may not be uniformly formed on the substrate because of a high solution surface tension. In such a case, an organic solvent may be added to the solvent.

Depending on a combination of the type of substances contained in the composition of the invention, materials of the substrate, methods for coating, a ratio of the composition and the solvent and so on; the ratio of water based on the total solvent used is preferably about 10 to about 100 wt. %, especially about 30 to about 100 wt. %, further especially about 50 to about 100 wt. %. When the amount of organic solvents is too great, the materials of the device and implements used for forming the film are limited to those which withstand organic solvents. However, the materials of the device and implements are less limited when the amount of the organic tin solvent is in the above-mentioned range. When an organic solvent is contained, a coating solution having a better wettability with respect to the substrate can be obtained due to a synergistic effect achieved by the organic solvent and the water-soluble organic high molecular compound. The ratio of water based on the total solvent is not restricted within the foregoing range but is suitably determinable in view of the solubility of the organic solvent in water.

Organic solvents compatible with water are usable in the invention. Even when a solvent comprising water and an organic solvent is used, the solution of the invention for forming a transparent conducting film is one in which the substances in the composition of the invention are uniformly dissolved in a uniform solvent comprising water and an organic solvent to provide a uniform solution as a whole.

More specifically, uniform solvent can be obtained by adjusting the mixing ratio between an organic solvent and water, provided that the organic solvent has a solubility of 1 wt. % or more in water at 20° C.

There is no limitation on the type of organic solvent having the above-specified solubility. For example, the organic solvent can be selected for use from organic solvents known per se such as alcohols, carboxylic acids, esters, ketones, ethers, amides, nitrogen compounds, etc.

Examples of alcohol solvents are methanol, ethanol, n-propyl alcohol, isopropyl alcohol, t-butyl alcohol (these solvents having an unlimited solubility in water at 20° C., i.e. being limitlessly compatible with water), n-butyl alcohol, sec-butyl alcohol (these solvents having a solubility of about 10 wt. % in water at 20° C.) and like alkanols; cyclohexanol (the solvent having a solubility of about 4 wt. % in water at 20° C.) and like cycloalkanols; ethylene glycol monomethyl ether, ethylene glycol monoethyl ether, ethylene glycol monoisopropyl ether, ethylene glycol mono n-butyl ether, diethylene glycol monomethyl ether, diethylene glycol monoethyl ether, diethylene glycol monobutyl ether, propylene glycol monomethyl ether, propylene glycol monoethyl ether, dipropylene glycol monomethyl ether, dipropylene glycol monoethyl ether, tripropylene glycol monomethyl ether (these solvents having an unlimited solubility in water at 20° C.) and like alkylene glycol ethers; ethylene glycol monomethyl ether acetate (the solvent having an unlimited solubility in water at 20° C.), ethylene glycol monoethyl ether acetate (the solvent having a solubility of about 23 wt. % in water at 20° C.) and like alkylene glycol acetates, and so on.

Examples of carboxylic acid solvents are acetic acid, propionic acid, n-butyric acid, alpha-methyl butyric acid and i-valeric acid.

Examples of ester solvents are ethyl acetate, propyl acetate and n-butyl acetate.

Examples of ketone solvents are acetone and methyl ethyl ketone.

Examples of ether solvents are diethyl ether and like aliphatic ethers, and tetrahydrofuran, dioxane and like cyclic ethers.

Examples of amide solvents are formamide and N-methylformamide.

Examples of nitrogen compounds include N-methyl pyrrolidone.

Such solvents can be used alone or at least two of them may be used in combination.

Alcohol solvents are preferred as the organic solvent. Among them, a solvent having a solubility of about 10 wt. % or more in water is preferable, a solvent having a solubility of about 20 wt. % or more in water is more preferable, and a solvent having an unlimited solubility in water, at 20° C. is most preferable. Examples of the organic alcohol solvents having such a solubility are methanol, ethanol, ethylene glycol monomethyl ether and ethylene glycol monoethyl ether and the like.

The water-soluble organic high molecular compound that is an essential component in the composition of the invention has low solubility in organic solvents depending on the type of solvent. An organic solvent that has the action of re-precipitating the water-soluble substances once dissolved in water so that the solvent would be likely to impair the uniformity of the solution.

Consequently, in order to retain the uniformity of the coating solution, the solvent for dissolving the composition of the invention preferably contains water in an amount of about 10 to about 100 wt. % based on the total solvent, irrespective of the solubility of the organic solvent, and the solution contains the water-soluble organic high molecular compound in an amount of about 0.03 to about 10 wt. %. More preferably the solvent contains water in an amount of about 30 to about 100 wt. % based on the total solvent and the content of the water-soluble organic high molecular compound in the solution is in the range of about 0.07 to about 10 wt. %. Most preferably the solvent contains water in an amount of about 50 to about 100 wt. % based on the total solvent, and the content of the water-soluble organic high molecular compound in the solution is in the range of about 0.1 to about 10 wt. %.

The amount of the solvent (water or a solvent comprising water and an organic solvent) may be, for example, about 5 to about 99 wt. % based on the total amount of the solution, preferably about 40 to 98 wt. %, depending on the method of coating. Depending on the method of coating, the amount of the solvent can be suitably selected to give a viscosity at which the coating solution is easily applied.

Preferred Properties of the Solution

The solution for forming a transparent conducting film according to the invention has preferably a surface tension of about 20 to 70 mN/m, and the solution has preferably a viscosity of 20 mPa·s or less. The solution preferably possesses both of these two properties and has more preferably a surface tension of about 20 to 50 mN/m, and a viscosity of 17 mPa·s or less, still more preferably a surface tension of about 20 to 40 mN/m, and a viscosity of 15 mPa·s or less.

The viscosity and the surface tension of the solution of the invention were determined by the methods to be described in EXAMPLE.

The solution having the foregoing viscosity and surface tension can be prepared by adjusting the kind and amount of solvents, kind and amount of the water-soluble organic high molecular compound and the amounts of water-soluble indium compounds and halogen-containing water-soluble organotin compounds.

The solution thus prepared can be easily applied by an ink jet method, and therefore an ITO film of complicated shape (pattern) can be formed without use of a mask with a high mass-productivity.

A transparent conducting film is formed by applying the solution for forming an transparent conducting film of the invention onto a transparent substrate, such as a glass substrate, by an ink jet method and firing the same. A light-emitting device is produced by laminating a device structure including an emission layer on the conducting film. light-emitting device thus produced gives off a more uniform light than a light-emitting device made of an ITO film formed by other methods. This is presumably because the ITO film is patterned by the ink jet method without use of a mask so that the periphery of the pattern is smoothly curved, i.e. a smoothly curved surface is formed at the periphery of the convex portion of the pattern and extends toward the emission layer.

When an ITO film, formed by the method comprising application of the solution having the above-specified surface tension and viscosity by an ink jet method, is particularly effective when used in a light-emitting device of full color type that is composed of a plurality of emission layers and capable of giving off light emission of two or more colors and luminescence of mixed colors with less color irregularity is achieved over the entire light-emitting surface.

External light such as sunrays can not easily penetrate into such light-emitting device, so that when a phosphor layer is formed in the light-emitting device, the light-emitting device can reduce the possibility that it looks as if it is on due to external light despite it is in the off state. Consequently the transparent conducting film patterned by an ink jet method using the solution having said viscosity and surface tension can be suitably used as an ITO film in a light-emitting device for outdoor displays.

(III) Method of Forming a Transparent Conducting Film

The method of forming a transparent conducting film according to the invention comprises the steps of (1) applying the above-described solution (coating solution) of the invention for forming a transparent conducting film onto a substrate, and (2) firing the coating film.

Substrate

Substrates usable in the invention are made of materials which will not change their properties by firing at about 700° C. that will be described later among known materials for substrates on which a transparent conducting film is formed. Materials for such substrates can be used as selected from the following examples according to the intended use: soda lime glass, quartz glass, alkali-free glass, borosilicate glass and like glasses; polyethylene terephthalate, polyimide, polyethylene naphthalate, cellulose triacetate, polyether sulfone, polycarbonate and like polymers and so on.

The shape of the substrate is not limited and can be any of film (thin film) form, thick film form, and mass form. The method of the invention is a coating method so that a transparent conducting film can be formed even on curved surfaces of, e.g., a molded product.

Applying Step

The method of applying the composition of the invention onto the surface of the substrate is not limited and includes, for example, screenprinting methods, roll coat methods, dip coat methods, spin coat methods and like known methods.

The printing method includes those capable of forming a pattern simultaneously with application of the solution as done in the ink jet method and can be employed. The dip coat method, spin coat method and ink jet method are especially preferred. The film thickness at the time of application may be suitably determined according to the intended use.

Firing Step

The firing temperature is higher than a temperature at which the substances constituting the composition of the invention decompose and is lower than the deformation temperature of the substrate. Firing can be carried out, for example, at about 300 to about 700° C., preferably about 350 to about 650° C., more preferably about 400 to about 550° C.

The firing time may be, e.g., about 1 minute to about 10 hours, preferably about 5 minutes to about 3 hours. If the firing time is too short, a transparent conducting film of high purity can not be formed, whereas an excessively long firing time extends the time period of producing a transparent conducting film as a whole. Hence excessively short or long firing times are not preferred. A highly pure transparent conducting film can be formed within a practical time insofar as the firing time is in the above-mentioned range.

The atmosphere during firing is not limited. The firing can be done, e.g., in air. It is desirable that the firing is carried out in an atmosphere higher in partial oxygen pressure than air. In this case, an ITO film of low resistance and higher transmittance can be obtained. A partial oxygen pressure of $5 \times 10^4$ Pa or higher is more preferred. The upper limit of partial oxygen pressure is not limited, and firing can be done in an atmosphere consisting solely of oxygen.

A Reducing Heat Treatment

The method of the invention may further include the step of subjecting the film obtained in step (2) to a reducing heat treatment. This step causes oxygen deficiency and generates free electrons, increasing the conductivity of the film and thereby forming a film of high conductivity.

The reducing heat treatment temperature may be in the range at which sufficient reduction can be carried out and the substrate is not deformed. Preferable temperature of the reducing heat treatment is usually about 150 to about 700° C., especially about 170 to about 650° C., further especially about 200 to about 600° C. Depending on the reducing atmosphere, the reducing heat treatment time-can be, e.g., about 3 minute to about 10 hours, and preferably about 5 minutes to about 6 hours. If the reducing heat treatment time is too short, the film is insufficiently reduced, consequently failing to enhance conductivity, whereas too long a reducing heat treatment time results in excessive reduction of film and lowers the crystallinity of the film, failing to give a transparent conducting film of high conductivity. The reducing heat treatment in the above range affords a highly conductive film.

Examples of the atmosphere for the reducing heat treatment includes, for example, nitrogen atmosphere, hydrogen atmosphere, nitrogen and hydrogen atmosphere, hydrogen plasma atmosphere, vacuum, etc. A nitrogen atmosphere, hydrogen atmosphere, and nitrogen and hydrogen atmosphere are preferable since they do not require the use of large-scale production equipment and they are low in cost.

(IV) Transparent Conducting Film

The transparent conducting film formed by the above mentioned method of the invention contains indium, tin, oxygen, carbon and halogen elements uniformly distributed therethrough. In the present invention, that these elements are "uniformly" distributed or exist in the film means a state of the film wherein a density distribution of these elements is found to be uniform when the surface and cross section of the film is observed by an electron probe microanalyzer (EPMA).

The transparent conducting film formed by the method of the invention contains indium, tin, oxygen, carbon and halogen, and the irregularity of the film thickness is 0.2% or less based on the measured thickness. The transparent conducting film formed by the method of the invention may have a transmittance of usually about 90 to about 98%, preferably about 92 to about 98%, more preferably about 94 to about 98% averaged over the wavelength range of 420 to 820 nm, when a measured film thickness is 0.01 to 0.4 µm. More specifically, when a measured film thickness is 0.01 to 0.15 µm, the transparent conducting film formed by the method of the invention may have a transmittance of about 92 to about 98%, preferably about 93 to about 98%, more preferably about 94 to about 98% averaged over the above wavelength range. When the measured film thickness is 0.15 to 0.25 µm, the transparent conducting film formed by the method of the invention may have a transmittance of about 90 to about 97%, preferably about 91 to about 97%, more preferably about 92 to about 97% averaged over the above wavelength range. When the measured film thickness is 0.25 to 0.4 µm, the transparent conducting film formed by the method of the invention may have a transmittance of about 90 to about 96%, preferably about 91 to about 96%, more preferably about 92 to 96% averaged over the above wavelength range.

The above described average transmittance of the transparent conducting film in the invention refers to an average of values obtained using a spectrophotometer by measuring the transmittance to light at wavelengths from 420 to 820 nm at a wavelength scanning rate of 120 nm/min.

The transparent conducting film of the invention preferably has a surface resistivity in the range of approximately $10^2$ to $10^8$ Ω/□, especially approximately $10^2$ to $10^6$ Ω/□, further especially approximately $10^2$ to $10^4$ Ω/□.

EXAMPLE

The invention will be described in more detail with reference to the following examples, to which however, the invention is not limited.

In the examples, the first endothermic peak temperatures of the indium and tin compounds, the viscosity and surface tension of the solution, and the weight average molecular weight of the water-soluble organic high molecular compound are measured by the following methods:

First Endothermic Peak Temperature

The sample to be tested is heated in air in a manner to bring about a constant temperature-elevating rate according to a differential thermal analysis method (JIS K0129-94). In this operation, a chemical reaction involving generation or absorption of heat causes a temperature difference between the sample being tested and a standard substance. A differential thermal analysis curve is drawn to plot the temperature difference (differential thermal analysis value) between the sample being tested and the standard substance.

Viscosity

The viscosity resisting torque of the solution to be tested as exerted on a cylinder or a circular plate being rotated in the solution being tested is measured with a model B type viscometer.

Surface Tension

The surface tension of the solution to be tested is determined in terms of the number of dropped droplets, specific gravity and surface tension of water when a specified amount of the solution being tested is slowly dropped from an opening of a pipe of circular section according to the method using a stalagmometer (JIS K3362).

Weight Average Molecular Weight of Water-Soluble Organic High Molecular Compound As determined by GPC (gel permeation chromatography)

Example 1

Into a 100 ml Erlenmeyer flask containing a stirring rod is placed an accurately weighed out amount of 12.0 g of indium nitrate trihydrate, 0.76 g of dimethyltin dichloride and 0.43 g of polyvinyl alcohol (weight average molecular weight: about 22,000). Further, 29.74 g of water is added thereto and the components are mixed at room temperature to give a solution, whereby a composition for forming a transparent conducting film is produced.

The obtained composition is applied to a heat-resistant glass substrate with a spin coater at 3000 rpm for 15 seconds in air, and is fired at 650° C. in air for 30 minutes in an electric furnace.

The first endothermic peak temperatures are 162.4° C. for indium nitrate trihydrate and 107.6° C. for dimethyltin dichloride, and the difference of temperature therebetween is 54.8° C.

Example 2

The same procedure as in Example 1 is repeated except that 9.6 g of indium chloride trihydrate is used instead of 12.0 g of indium nitrate trihydrate as the water-soluble indium compound and after the firing step a reducing heat treatment was conducted at 650° C. for 5 hours in a nitrogen atmosphere.

The first endothermic peak temperatures are 185.2° C. for indium chloride trihydrate and 107.6° C. for dimethyltin dichloride, and the difference of temperature therebetween is 77.6° C.

Example 3

Into a 100 ml Erlenmeyer flask containing a stirring rod is placed an accurately weighed out amount of 12.0 g of indium nitrate trihydrate, 0.76 g of dimethyltin dichloride and 0.64 g of polyvinyl alcohol (weight average molecular weight: about 88,000). Then, 28.10 g of water is added thereto and the components are mixed at room temperature to give a solution. Furthermore, 1.43 g of a 30% aqueous solution of hydrogen peroxide is added to the solution and the components are mixed at room temperature, whereby a composition for forming a transparent conducting film is produced.

The obtained composition is applied to a heat-resistant glass substrate with a spin coater for 15 seconds at 3000 rpm in air, and is fired at 500° C. in an oxygen atmosphere for 30 minutes in an electric furnace, and a reducing heat treatment is conducted at 500° C. for 1 hour in a mixed gas atmosphere (92% nitrogen/8% hydrogen).

The difference in the first endothermic peak temperatures between indium nitrate trihydrate and dimethyltin dichloride is 54.8° C. as described above.

Example 4

The same procedure as in Example 3 is carried out with the exception of using a solvent mixture of 14.05 g of water and 14.05 g of methanol as the solvent in place of water.

As described above, the difference between the first endothermic peak temperatures of indium nitrate trihydrate and dimethyltin dichloride is 54.8° C. The solution thus obtained has a viscosity of 14 mPa·s and a surface tension of 33 mN/m.

Example 5

The same procedure as in Example 3 is carried out with the exception of using 0.64 g of polyethylene glycol (weight average molecular weight about 5,00,000) as the water-soluble organic high molecular compound in place of polyvinyl alcohol and using 0.3 g of picric acid as a thermal decomposition catalyst in place of hydrogen peroxide.

As described above, the difference between the first endothermic peak temperatures of indium nitrate trihydrate and dimethyltin dichloride is 54.8° C.

Comparative Example 1

Into a 100 ml Erlenmeyer flask containing a stirring rod is placed an accurately weighed out amount of 12.0 g of indium nitrate trihydrate, and 0.76 g of dimethyltin dichloride. Then, 29.74 g of water is added thereto and the components are mixed at room temperature to dissolve the components, whereby a composition for forming a transparent conducting film is produced.

The obtained composition is applied to a heat-resistant glass substrate with a spin coater for 15 seconds at 3000 rpm in air, and is fired at 650° C. in air for 30 minutes in an electric furnace.

Measurements are made of the film thickness, surface resistivity and transmittance to visible light at 550 nm of the transparent conducting films produced in Examples 1 to 5 and Comparative Example 1. The film thickness is measured by the reflectance spectral method. The surface resistivity was measured according to JIS K7194 (four-terminal four-point probe method). The transmittance is measured by a spectrophotometer. The results are shown in Table 1.

TABLE 1

|  | Film thickness (μm) | Surface resistivity (Ω/□) | Transmittance at 550 nm (%) |
| --- | --- | --- | --- |
| Example 1 | 0.05 | 1900 | 93 |
| Example 2 | 0.05 | 370 | 93 |
| Example 3 | 0.07 | 200 | 95 |
| Example 4 | 0.06 | 120 | 95 |
| Example 5 | 0.05 | 140 | 95 |
| Comparative Example 1 | 0.05 | 6000 | Milky white |

As apparent from Table 1, the ITO film formed in Example 1 has a surface resistivity of 1900 (Ω/□), i.e., a practically sufficient conductivity, as well as a practically sufficient transmittance. The ITO film having this degree of surface resistivity can be suitably used as an electromagnetic wave shielding film or an antistatic In Examples 2 to 5 wherein a reducing heat treatment was conducted, ITO films having a surface resistivity of 120 to 370 (Ω/□), i.e. a low resistance and a high transmittance are obtained. The ITO films of this degree of surface resistivity can be suitably used as a film heating element or a transparent electrode. In Examples 3 to 5 in which a firing step is performed in an oxygen atmosphere, ITO films having a lower resistance than that obtained in Example 2 in which the firing step is conducted in air are formed.

In Comparative Example 1 using a composition free of polyvinyl alcohol that is a water-soluble organic high molecular compound, a uniform coating film can not be formed. As a result, the film obtained after firing is milky white. A film having a high transmittance is not obtained, and has a relatively high surface resistivity.

The visible light average transmittance over the range of 420 to 820 nm was measured with respect to the transparent conducting films obtained in Examples 1 to 5 and Comparative Example 1. As a result, the reduction ratio from the transmittance to visible light at 550 nm is 0.5% or less, i.e. substantially the same transmittance as observed for visible light of 550 nm is exhibited. This shows that the transparent conducting films of the invention have a high transmittance to visible light of any wavelength.

The invention claimed is:

1. A composition for forming a transparent conducting film, the composition comprising a water-soluble indium compound, a halogen-containing water-soluble organotin compound and a water-soluble organic high molecular weight compound.

2. The composition according to claim 1, wherein the halogen-containing water-soluble organotin compound is one in which a first endothermic peak temperature in a differential thermal analysis curve is 75° C. or higher.

3. The composition according to claim 1, wherein the difference between the first endothermic peak temperature of the water-soluble indium compound and the first endothermic peak temperature of the halogen-containing water-soluble organotin compound in the differential thermal analysis curve is 100° C. or less.

4. A solution for forming a transparent conducting film, the solution having the composition of claim 1, 2 or 3 dissolved in water or a solvent comprising water and an organic solvent.

5. The solution according to claim 4, wherein water is present in a ratio of 10 to 100 wt. % based on the total solvent, and the water-soluble organic high molecular weight compound is present in a ratio of 1 to 10 wt. % based on the total solution.

6. The solution according to claim 4 which has a surface tension of 20 to 70 mN/m and a viscosity of 20 mPa·s or less.

7. A method for forming a transparent conducting film, which comprises the steps of
(1) applying the solution of claim 4 onto a substrate, and
(2) firing the coating film.

8. The method according to claim 7, wherein the firing is carried out in an atmosphere which has higher partial oxygen pressure than air in step (2).

9. The method according to claim 7, which further comprises a step of subjecting the film obtained in step (2) to a reducing heat treatment.

10. The method according to claim 7, wherein the solution of step (1) has water in a ratio of 10 to 100 wt. % based on the total solvent, and has the water-soluble organic high molecular weight compound in a ratio of 0.03 to 10 wt. % based on the total solution.

11. The method according to claim 7, wherein the solution of step (1) has a surface tension of 20 to 70 mN/m and a viscosity of 20 mPa·s or less.

12. The composition according to claim 1, wherein the halogen-containing water-soluble organotin compound is at least one compound selected from the group consisting of compounds represented by the formula (1)

$$R_n SnX_{4-n} \qquad (1)$$

wherein R is an alkyl group having 1 to 3 carbon atoms, X is a halogen atom and n is an integer from 1 to 3.

13. The composition according to claim 1, wherein the halogen-containing water-soluble organotin compound is dimethyltin dichloride.

14. The composition according to claim 1, wherein the water-soluble indium compound is at least one compound selected from the group consisting of indium chloride, indium nitrate, indium perchlorate, and indium sulfate.

15. The composition according to claim 1, wherein the halogen-containing water-soluble organotin compound is dimethyltin dichloride and water-soluble indium compound is indium chloride trihydrate or indium nitrate trihydrate.

16. The composition according to claim 1, wherein the water-soluble organic high molecular weight compound is at least one compound selected from the group consisting of polyvinyl alcohol, polyethylene glycol and polyvinyl pyrrolidone.

* * * * *